United States Patent
Smiley et al.

(10) Patent No.: US 6,373,331 B1
(45) Date of Patent: Apr. 16, 2002

(54) METHOD AND APPARATUS FOR REDUCING TRANSISTOR AMPLIFIER HYSTERESIS

(75) Inventors: Russell C. Smiley, Nepean; Johan M. Grundlingh, Kinburn; John J. Ilowski, Nepean; Robert Leroux, Ottawa, all of (CA)

(73) Assignee: Nortel Networks Limited, St. Laurent ( * ) Notice: Subject to any disclaimer, the term of this patent is extended or adjusted under 35 U.S.C. 154(b) by 0 days.

(21) Appl. No.: 09/658,668

(22) Filed: Sep. 8, 2000

Related U.S. Application Data (63) Continuation-in-part of application No. 09/469,222, filed on Dec. 22, 1999.

(51) Int. Cl.[7] .............................. H03F 1/26; H03F 3/60
(52) U.S. Cl. ..................... 327/545; 327/427; 327/478; 330/296; 330/302
(58) Field of Search ................... 327/427, 478, 327/530, 545; 330/296, 302

(56) References Cited

U.S. PATENT DOCUMENTS

| | | | | |
|---|---|---|---|---|
| 5,406,224 A | * | 4/1995 | Mikami et al. ............. 330/277 |
| 5,742,206 A | * | 4/1998 | Ishida ........................ 330/145 |
| 5,994,964 A | * | 11/1999 | Tanemura ................... 330/285 |
| 6,052,033 A | * | 4/2000 | Schneider .................. 330/302 |
| 6,166,599 A | * | 12/2000 | Aparin et al. ............... 330/302 |
| 6,236,274 B1 | * | 5/2001 | Liu ............................. 330/302 |

* cited by examiner

*Primary Examiner*—Kenneth B. Wells
*Assistant Examiner*—Terry L. Englund
(74) *Attorney, Agent, or Firm*—Dennis R. Haszko (57) ABSTRACT

A biasing method and apparatus which provides bias circuits of radio frequency (RF) power transistors with a low reactive impedance at low frequencies to reduce hysteresis related distortion without affecting the transistor input or output impedance or any impedance matching network which may be used. In one embodiment, reduced hysteresis within a lateral diffused metal-oxide semiconductor (LDMOS) transistor is brought about by a drain bias circuit without any impact on the transistor output impedance. By removing the effect of the bias circuit at RF frequencies, the bias circuit can be designed with a low reactive impedance at low frequencies without any material consequences on the transistor output impedance. With a low enough reactive impedance, the hysteresis introduced by the bias circuit is substantially reduced. An auxiliary bias feed external to an RF transistor package is also embodied.

7 Claims, 10 Drawing Sheets

METHOD AND APPARATUS FOR REDUCING TRANSISTOR AMPLIFIER HYSTERESIS

CROSS REFERENCE TO RELATED APPLICATIONS

This is a continuation-in-part of U.S. patent application Ser. No. 9/469,222 filed on Dec. 22, 1999.

BACKGROUND OF THE INVENTION

1. Field of the Invention

The present invention relates to radio frequency (RF) power transistors and more particularly to the biasing of RF power transistors.

2. Description of the Prior Art

In today's communications systems, it is highly desirable to use linear RF amplifiers that can operate with high power efficiency and low distortion. As is well known, these RF amplifiers include cascaded RF power transistors to provide multiple stages of amplification.

There are presently various classes of RF amplifiers where each class is characterized by a particular efficiency and distortion level. For example, class A amplifiers are characterized by a low power efficiency and, of all the amplifier classes, introduce the least distortion. Class AB amplifiers are more efficient but introduce more distortion. RF amplifiers with high efficiency such as class AB amplifiers are typically useful because of their increased efficiency.

One concern related to the use of high efficiency RF amplifiers is their inherent non-linearity. There are presently various conventional methods that can be used to increase linearity in RF amplifiers and thereby reduce the amount of distortion introduced. One conventional method of linearizing RF amplifiers consists of using feedback. With feedback, RF amplifiers can be linearized simply and inexpensively. However, as is well known, the amount of linearization or reduction in distortion achievable is limited by various feedback delays.

Feedforward is another method by which RF amplifiers can be linearized. This linearization approach consists of canceling the distortion of the RF amplifier at the output. More specifically, the distortion introduced by the RF amplifier is measured with an error signal produced by comparing the RF amplifier output signal with the input signal. After suitable scaling and delay matching, this error signal is applied to the RF amplifier output to reduce the distortion introduced by the RF amplifier. However, as is well known, this linearization method reduces the efficiency and increases the bulkiness of the RF amplifier.

A more desirable method of linearizing an RF amplifier consists of predistorting the input signal of the RF amplifier so that at the output, the distortion introduced in the RF amplifier is cancelled. According to this method, in order to effectively predistort a signal input to an RF amplifier to cancel out the distortion introduced in the RF amplifier, the distortion characteristics or behavior of the RF amplifier must be measurable. As is well known, there are various types of distortion, which can be introduced by an RF amplifier such as for example, amplitude-to-amplitude (AM/AM) modulation and/or amplitude-to-phase (AM/PM). Generally, these types of disortion can be quantified with some confidence to determine the appropriate pre-distortion necessary at the RF amplifier input.

One exception to this however is hysteresis. Hysteresis is a particular type of distortion that arises at RF operations including operations at and beyond ultra high frequencies (UHF). Hysteresis is a distortion behavior inherent to most RF amplifiers that cannot be easily quantified or cancelled with conventional predistortion techniques. In conventional RF amplifiers, hysteresis causes distortion in proportion to the rate of change of the input signal being amplified. For example, the amount of hysteresis introduced in an input signal may at any given time depend on the recent history of the signal, the rate at which the signal operates or whether the input signal is on a rising edge or a falling edge.

Because the hysteresis introduced changes dynamically in sympathy with the rate of change of the signal being amplified, it becomes virtually impossible to predict the hysteresis behavior in an RF amplifier and predistort an input signal so as to cancel the related distortion introduced.

It has been observed that a major cause of hysteresis in a conventional RF amplifier arises from bias circuitry used to bias the RF power transistors in the amplifier. As is well known, the bias circuitry of an RF power transistor is used to feed a DC current supply to a drain/collector or gate/base terminal of the RF power transistor so that the transistor can operate. Generally, the DC current the RF power transistor draws is a function of the amplitude of the input signal. Because of this dependency and the fact that the reactive impedance of the bias circuit is non-zero, hysteresis is introduced in the output signal. To minimize this distortion, it becomes highly desirable to design the bias circuitry impedance with the lowest possible reactance at low frequencies (ideally zero) such that DC current can be applied to the RF power transistor without affecting the signal being amplified.

However, at RF frequencies, the bias circuit impedance also has an effect on the transistor output and input impedance. In most cases, impedance matching networks will be used at both the input and the output of an RF power transistor to match the transistor input and output impedance with external components. For example, an output impedance matching network will be used to match the relatively low output impedance of the RF power transistor at RF frequencies to the higher one of external circuits which, according to current microwave practice is typically 50 ohms. Because the impedance of the bias circuit impacts on the transistor input and output impedance, it is also equally desirable to design the bias circuitry with a high feed impedance at RF frequencies so as not to affect any impedance matching network which may be used.

Because of these conflicting requirements, the design of bias circuits in conventional RF power transistors has always entailed a trade-off. On one hand, bias circuits must be designed with a high impedance at RF frequencies so as not to affect the transistor input and output impedance or any impedance matching circuit used. On the other hand, the bias circuits must also be designed with a low reactive impedance at low frequencies so as not to introduce any hysteresis distortion in the signal being amplified.

In conventional RF power transistors, the emphasis is usually placed on designing bias circuits with a high impedance at RF frequencies so that the transistor input and output impedance is not affected. However, by doing so, the bias circuit reactive impedance at low frequencies is also increased which therefore inevitably induces hysteresis in signals being amplified.

Therefore it would be desirable to provide RF power transistors with a biasing method and apparatus which can provide a low reactive impedance at low frequencies to reduce hysteresis without affecting the transistor input or output impedance or any impedance matching circuit which may be used.

SUMMARY OF THE INVENTION

The present invention provides a biasing method and apparatus for a radio frequency (RF) power transistor that reduces hysteresis in the RF power transistor without affecting the transistor input or output impedance or any impedance matching network that may be used. The invention can be implemented on the input or output side of any power transistor which can operate at RF frequencies including for example, bipolar junction transistors (BJT) or any type of metal-oxide semiconductor field-effect transistors (MOSFET) including laterally diffused metal-oxide semiconductor (LDMOS) transistors and gallium arsenide field effect transistors (GaAs FET).

In one embodiment, the invention is used to provide a drain bias to an LDMOS transistor in an LDMOS transistor circuit in a manner that reduces hysteresis without any impact on the LDMOS transistor output impedance. In this embodiment, the drain bias is supplied with a drain bias circuit and fed through a low RF impedance point in the LDMOS transistor circuit so that at RF frequencies, the bias circuit no longer adversely impacts the transistor output impedance.

By removing the effect of the bias circuit at RF frequencies, the bias circuit can advantageously be designed with a low reactive impedance at low frequencies without any material consequences on the transistor output impedance. As a result, with a low enough bias circuit reactive impedance, the hysteresis introduced can be substantially reduced.

According to another embodiment, the drain bias is maintained on the drain terminal and a large capacitor is used at an appropriate point in the output matching circuit to reduce hysteresis.

According to yet another embodiment, the invention is used to provide a base bias to a BJT transistor in a BJT transistor circuit in a manner which reduces hysteresis without any impact on the BJT transistor input impedance. In this embodiment, the base bias is supplied with a base bias circuit and fed through a low RF impedance point in the BJT transistor circuit so that at RF frequencies, the base bias circuit no longer adversely impacts the transistor input impedance. Again, by removing the effect of the base bias circuit at RF frequencies, the base bias circuit can advantageously be designed with a low reactive impedance at low frequencies to reduce hysteresis without any material consequences on the transistor input impedance.

Because hysteresis in RF power transistors can be considerably reduced on both the input and output side, RF amplifiers which use RF power transistors can advantageously be linearized with predistortion techniques which are more cost-effective and simple than other linearization techniques and which in turn reduce the cost, complexity and bulkiness of RF amplifiers.

According to still another embodiment, the invention is used to provide one or more auxiliary bias feeds to a previously manufactured bias feed network of a BJT transistor in a BJT transistor circuit (or some similar transistor and circuit) in a manner which reduces hysteresis.

Other aspects and features of the present invention will become apparent to those ordinarily skilled in the art upon review of the following description of specific embodiments of the invention in conjunction with the accompanying figures.

DETAILED DESCRIPTION OF THE INVENTION

Embodiments of the present invention provide a biasing method and apparatus for a radio frequency (RF) power transistor which provides a low reactive impedance at low frequencies to reduce hysteresis in the RF power transistor without affecting the transistor input or output impedance or any impedance matching network which may be used. The invention can be implemented on the input or output side of any power transistor which can operate at RF frequencies including for example, bipolar junction transistors (BJT) or any type of metal-oxide semiconductor field-effect transistors (MOSFET) including laterally diffused metal-oxide semiconductor (LDMOS) transistors. For the purpose of example, the embodiments are hereinafter described in reference to the output side of an LDMOS transistor and to the input side of a BJT.

Figure 1A:
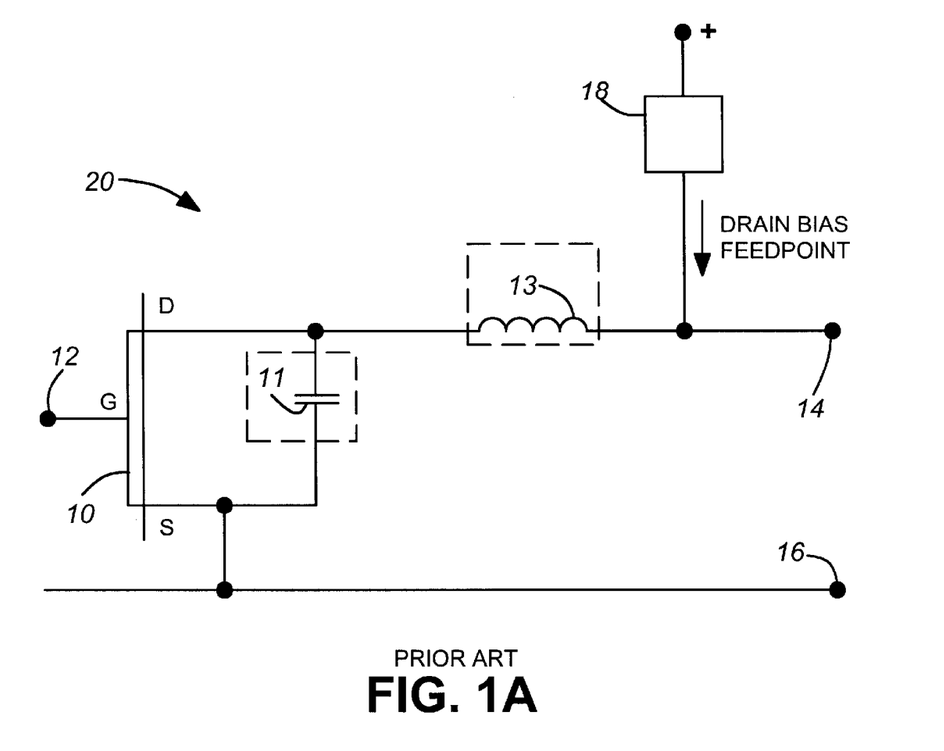
FIG. 1A is a diagram of a conventional radio frequency (RF) power transistor circuit with a drain bias circuit connection.

Referring to FIG. 1A, there is illustrated a diagram of a conventional LDMOS RF power transistor circuit 20 which includes an LDMOS RF power transistor 10 (hereinafter also referred to as the RF power transistor 10) and other components. The RF power transistor 10 is formed of semiconductor material and is shown with a gate G, a drain D and a source S. As is well known, RF power transistors such as the RF power transistor 10 are typically manufactured in a circuit package that includes a terminal connection from each of the gate G and drain D to an external point on the package 20. These terminal connections are typically made of bond wires and respectively define a gate terminal 12 and a drain terminal 14. The source S is on the other hand is directly connected to the circuit package flange that defines the source terminal 16.

As for any other conventional transistor, the RF power transistor 10 has certain intrinsic input and output terminal characteristics that can be measured at the transistor circuit terminals 12, 14 and 16. Considering in particular its output terminal characteristics, an output capacitance can be measured between the drain and the source terminals 14, 16. For clarity, this output capacitance is shown external to the transistor 10 as a capacitor 11. For the purpose of example, the capacitor 11 is assumed to be a 54 picoFarads (pF) capacitor which is typical for most RF power transistors.

The transistor 10 is also shown with a drain inductor 13 that extends away from the transistor drain D. This inductor 13 is a measure of the inductance introduced as a result of providing terminal connectivity from the drain D to a point external to the circuit package 20. As an example, for a standard 60 Watt RF power transistor designed to operate at 2 gigahertz (GHz), this inductance is typically in the order of 0.12 nanoHenries (nH) but could also be more or less than 0.12 nH, depending on various factors such as the frequency of operation, the power level, the manufacturing techniques and materials used. For the purpose of example, the drain inductance 13 is assumed to be 0.12 nH.

For drain bias, a bias circuit 18 is connected to the drain terminal 14 that defines the drain terminal 14 also as a drain bias feedpoint. The bias circuit 18 provides the transistor drain D with a drain biasing current that may be for example, a positive direct current (DC). However, it is to be understood that depending on the MOSFET design of the transistor 10, the bias circuit 18 could also be connected to provide a negative biasing current.

Figure 1B:
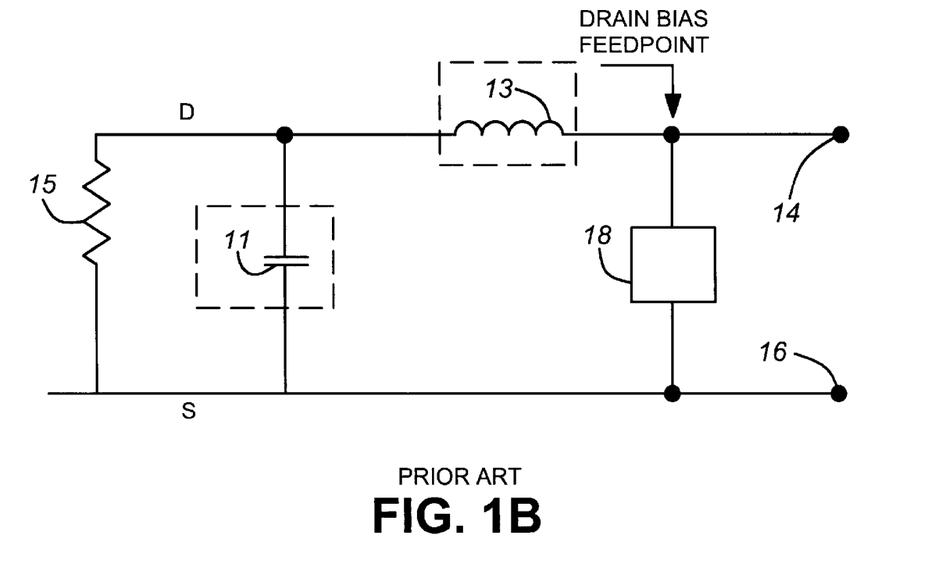
FIG. 1B is an equivalent diagram of the RF power transistor circuit of FIG. 1A at RF frequencies showing in particular an unmatched output.

As will be explained below in further detail, the bias circuit 18 is conventionally designed with resonant elements or quarter-wave stubs to provide a high impedance at RF frequencies so that the output impedance of the transistor 10 at these frequencies is not affected. Referring now to FIG. 1B, there is shown a equivalent circuit for the transistor 10 at RF frequencies to better illustrate the transistor output impedance as seen between the drain and the source terminals 14, 16. The output impedance of the transistor 10 at these frequencies can be modeled as the output capacitor 11 connected in parallel with a load impedance 15 which, for this example is set to 3 ohms. Generally, for conventional LDMOS transistors such as the RF power transistor 10, the output capacitance modeled by the capacitor 11 reduces the transistor output impedance. The drain inductor 13 on the other hand affects the reactive component of the transistor output impedance and must also be considered when determining the transistor output impedance seen between the drain and source terminals 14, 16.

Because the bias feedpoint is located on the drain terminal 14, the bias circuit 18 introduces at RF frequencies an impedance extending between the drain terminal 14 and the source terminal 16 which has a tangible effect on the transistor output impedance seen between these terminals. It can be appreciated that if the bias circuit impedance is too low, it may seriously reduce the transistor output impedance. It becomes therefore highly desirable to design the bias circuit 18 with a high impedance at these frequencies so that it does not affect the transistor output impedance. Conventionally, the bias circuit 18 is designed with a high impedance at these frequencies so that it does not affect the transistor output impedance. Even with a high impedance bias circuit 18 however, the transistor output impedance in this arrangement is nevertheless quite low (see above) and certainly not matched to standard microwave impedances which can be for example 50 or 75 ohm.

Figure 2A:
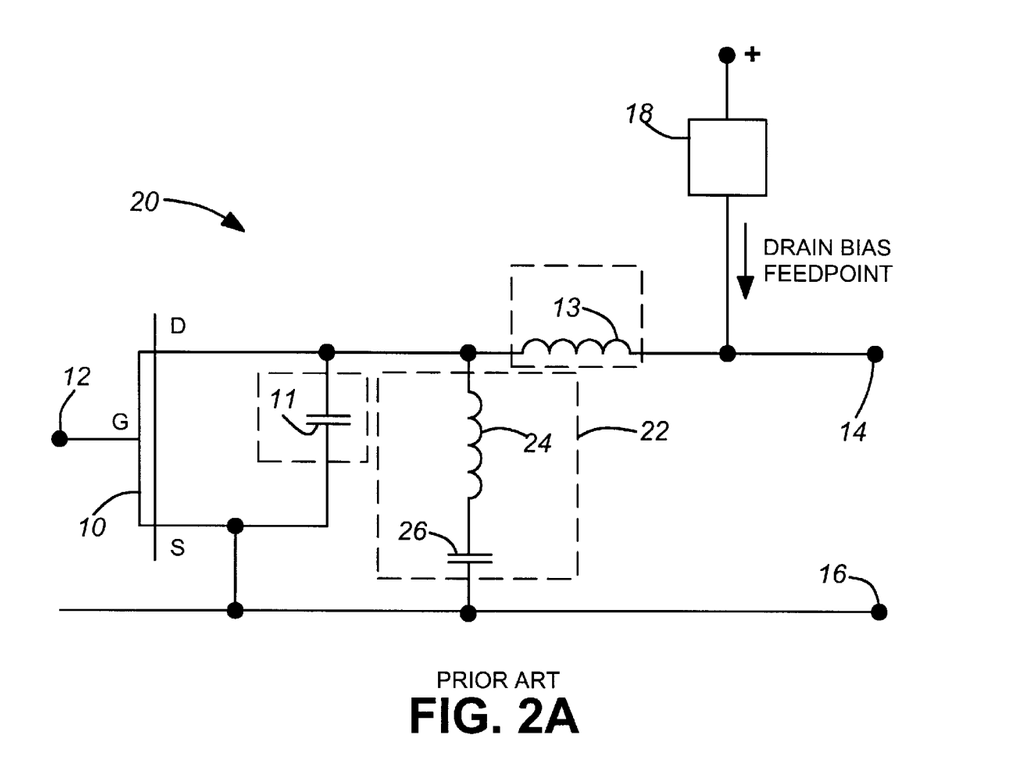
FIG. 2A is another diagram of the RF power transistor circuit of FIG. 1A packaged with an output impedance matching network in a conventional manner.

In an attempt to increase the transistor output impedance, most conventional RF power transistors are packaged with an output impedance matching network. FIG. 2A provides an example of this. In this figure, the transistor 10 of FIG. 1 is shown equipped with an output-matching network generally denoted by 22. The output matching network 22 is connected between the drain D and the source S of the transistor 10 and consists of an inductor 24 of for example 0.14 nH connected in series with a capacitor 26 set with a relatively large value to become a short circuit at RF frequencies (further details below). The main purpose of this impedance matching network 22 is to use the inductor 24 to resonate out the output capacitance 11 and improve the transistor output impedance.

Figure 2B:
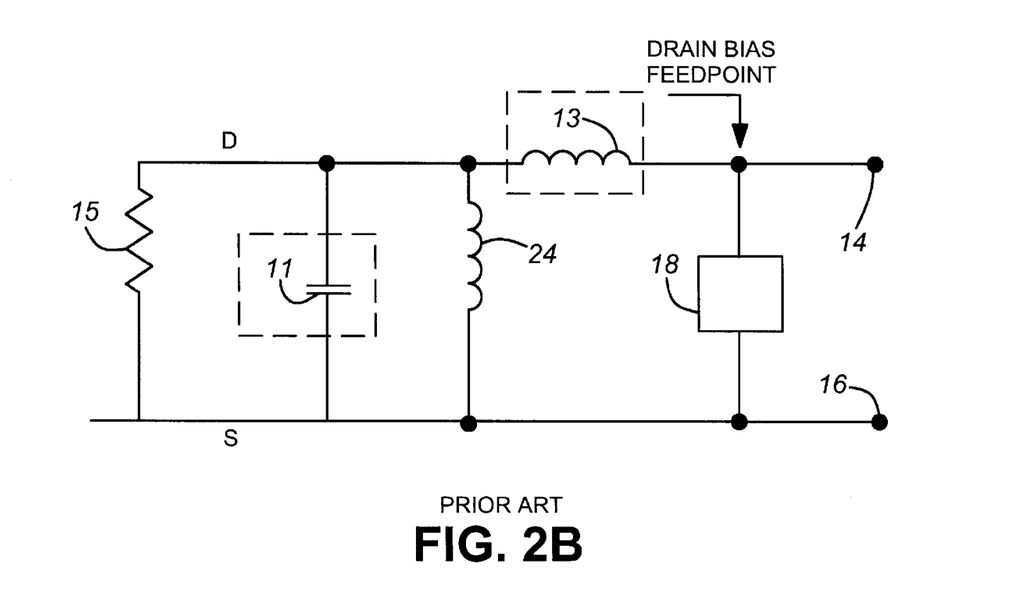
FIG. 2B is an equivalent diagram of the conventional RF power transistor circuit of FIG. 2A at RF frequencies showing in particular an improved output impedance.

FIG. 2B illustrates the transistor 10 at RF frequencies. As it can be seen from this figure, the capacitor 26 is sufficiently large (e.g. 700 pF) so that at these frequencies, it becomes a short circuit. As a result, the 0.14 nH inductor 24 of the impedance matching network 22 operates to resonate out the 54 pF output capacitance 11.

Despite the presence of the output impedance matching network 22, the bias circuit 18 may still have a material effect on the output impedance at RF frequencies. Because of this, as noted above, the bias circuit 18 will be designed to have a high impedance at RF frequencies so that it does not impact the transistor output impedance. Unfortunately, a high impedance at Rf frequencies will also arise at low frequencies and inevitably causes hysteresis.

As is well known, the hysteresis brought about by the reactive component of the bias circuit 18 causes distortion in proportion to the rate of change of the input signal being amplified. For example, the amount of hysteresis introduced in an input signal may at any given time depend on the recent history of the signal, the rate at which the signal operates or whether the input signal is on a rising edge or a falling edge.

Figure 2C:
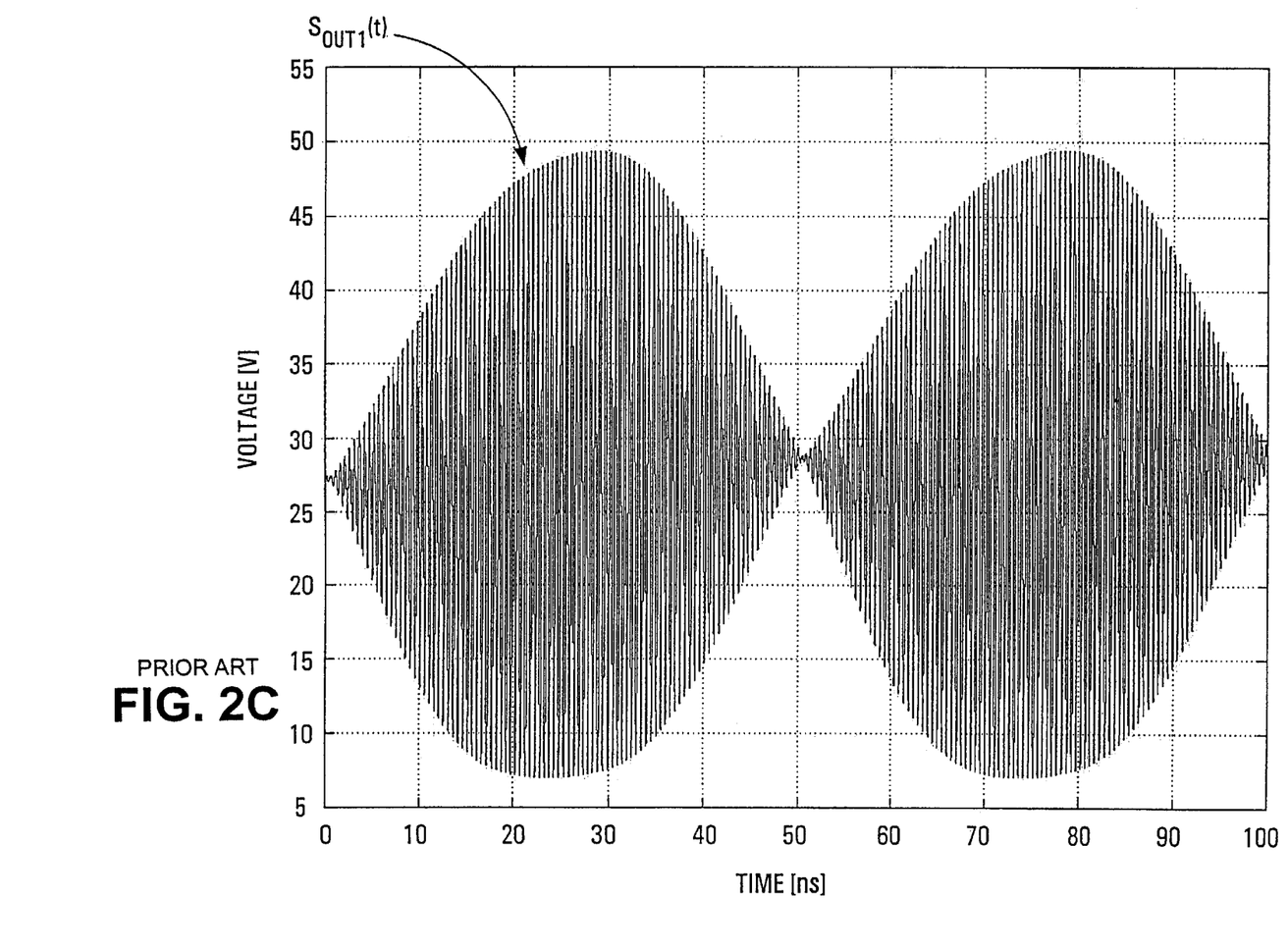
FIG. 2C is a voltage/time plot of an output signal Sout1(t) produced by the RF power transistor circuit of FIG. 2A.

To further illustrate this, reference is now made to FIG. 2C which illustrates a voltage/time plot of a two-tone output signal Sout1(t) produced by the RF power transistor 10 of FIG. 2A for an 8 nH bias circuit reactive impedance which represents a relatively high bias circuit reactive impedance at low frequencies. The output signal Sout1(t) is measured at the drain terminal 14 relative to the source terminal 16 and is shown in FIG. 2C for a period of 100 nanoseconds (ns). To illustrate the hysteresis distortion brought about by the bias circuit 18 with clarity, the output signal Sout1(t) is shown to have a large peak-to-peak amplitude that, for the purpose of example is approximately 45 volts. It is understood that typically, the output signal Sout1(t) would be smaller in amplitude for much of the time with occasional peaks of large amplitude.

From the output signal Sout1(t), it can be observed that because of the high reactive impedance of the bias circuit 18, the signal Sout1(t) appears distorted. More specifically, because of the hysteresis distortion introduced, the signal Sout1(t) is skewed and behaves differently on rising edges than on falling edges. It becomes apparent that irrespective of any predistortion technique used, it would be virtually impossible to predict and cancel the hysteresis introduced in the signal Sout1(t).

According to the invention, in order to reduce the hysteresis brought about by the bias circuit 18 without adversely affecting the transistor output impedance, the drain bias is fed through a low impedance point at RF frequencies (or a low RF impedance point). By feeding the drain bias through a low RF impedance point, the bias circuit 18 no longer adversely impacts the transistor output impedance at RF frequencies and can advantageously be designed with a low reactive impedance at low frequencies without any material consequences on the transistor output impedance. As a result, with a low enough reactive impedance, the hysteresis introduced can be substantially reduced.

Figure 3A:
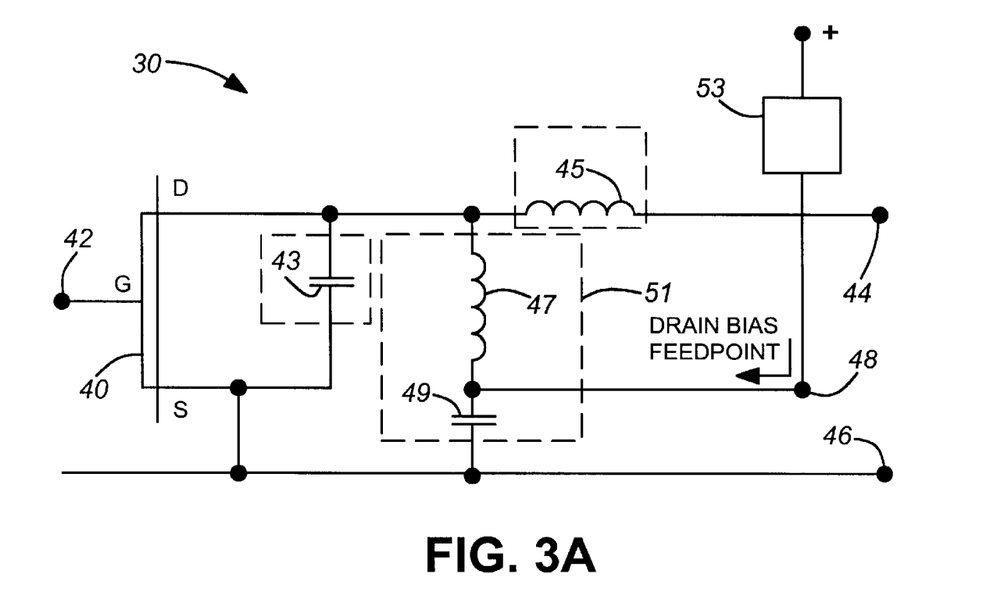
FIG. 3A is a diagram of a RF power transistor circuit packaged with a drain bias circuit connection according to a embodiment of the invention.

Referring now to FIG. 3A, there is shown a transistor circuit 30 designed in accordance with a embodiment of the invention. The transistor circuit 30 shown therein comprises a conventional RF power transistor 40 which, similarly to the RF power transistor 10 shown in previous figures can also be any power transistor which can operate at RF frequencies including for example FET transistors, LDMOS transistors or BJT transistors. For the purpose of example, the transistor 40 is also assumed to be an LDMOS transistor.

As is conventional, the RF power transistor 40 has a gate G, a drain D and a source S which are respectively connected to a gate terminal 42, a drain terminal 44 and a source terminal 46 on the transistor circuit 30. The drain terminal connection introduces a drain inductance represented by the inductor 45. Similarly to the transistor 10 described above in relation to FIG. 2A, the transistor 40 is also packaged with an output impedance matching network 51 formed of an inductor 47 and a capacitor 49. These components are connected in series between the transistor drain D and source S to increase the transistor output impedance as seen between the drain and source terminals 44, 46.

According to the embodiment, instead of feeding the drain bias through the drain terminal 44 as is conventionally done, the drain bias is fed at a low RF impedance point in the output impedance matching network 51 between the inductor 47 and the capacitor 49. For this, the transistor circuit 30 is packaged with an additional terminal 48 to provide the necessary external connectivity for feeding the drain bias into this low RF impedance point. By feeding the drain bias through a low RF impedance point, the bias circuit 53 no longer adversely impacts the transistor output impedance.

Figure 3B:
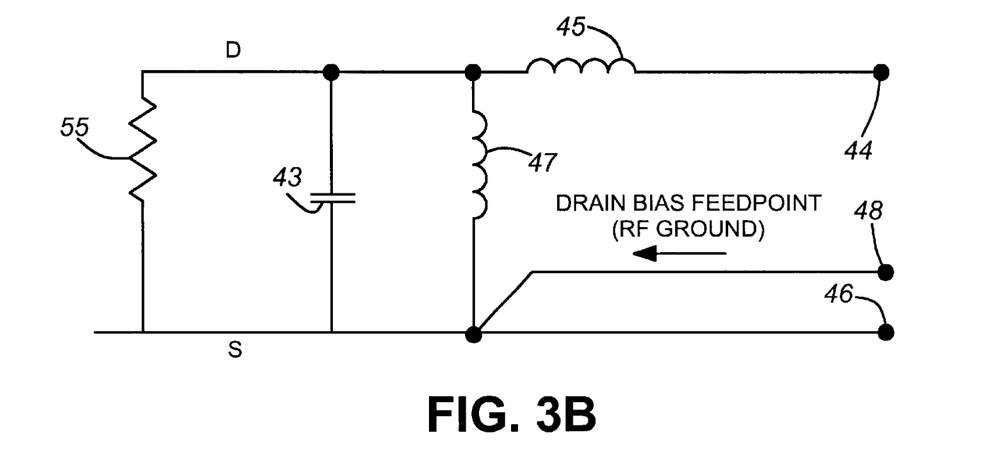
FIG. 3B is an equivalent diagram of the RF power transistor circuit of FIG. 3A at RF frequencies.

To further illustrate this, reference is now made to the diagram of FIG. 3B where the transistor circuit 30 is shown operating at RF frequencies. Similarly to the transistor circuit 20 described above in relation to FIGS. 2A and 2B, the capacitor 49 (see FIG. 3A) is sufficiently large (e.g. 700 pF) so that at RF frequencies, it becomes a short circuit and the inductor 47 operates to resonate out the output capacitance 43.

In the embodiment, because the capacitor 49 acts as a short circuit, the drain bias feedpoint, which conventionally is live on the drain terminal 44, falls instead to RF ground. The bias circuit 53 is shorted out and can as a result be designed with a much lower reactive impedance at low frequencies to substantially reduce hysteresis without adversely affecting the transistor output impedance. Experiments have shown that by placing the drain bias feedpoint between the inductor 47 and the capacitor 49, the bias circuit 53 can be designed with an impedance that can be reduced by a factor of 10 therefore considerably reducing the hysteresis which would otherwise be introduced.

Figure 3C:
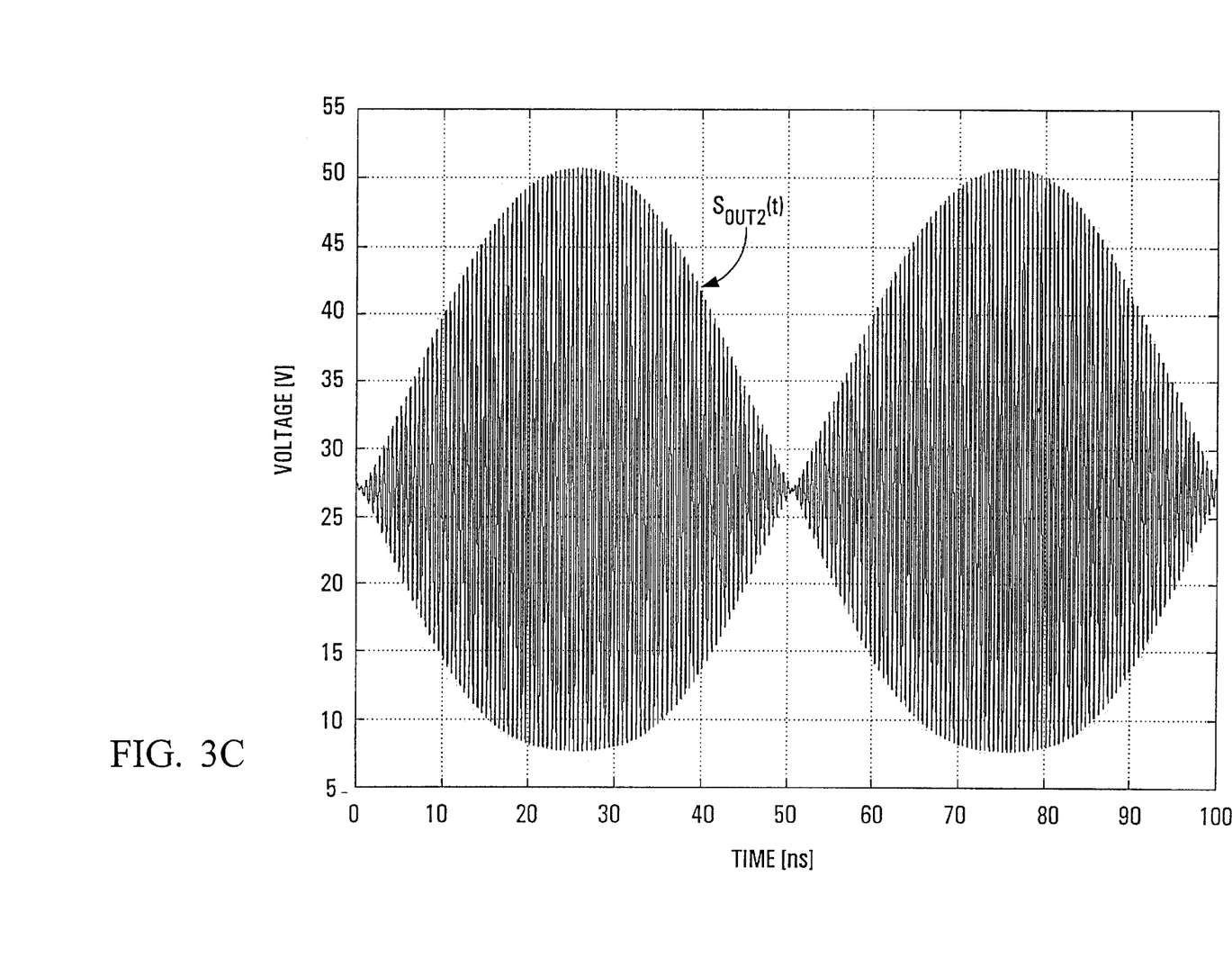
FIG. 3C is a voltage/time plot of an output signal Sout2(t) produced by the RF power transistor circuit of FIG. 3A.

To further illustrate this, reference is now made to FIG. 3C which illustrates a voltage/time plot of a two-tone output signal Sout2(t) obtained with the bias circuit reactive impedance reduced from 8 nH to 0.3 nH. From the output signal Sout2(t) and in comparison to the output signal Sout1(t), it can observed that because of the lower reactive impedance of the bias circuit 53, the hysteresis present in the output signal Sout1(t) has been considerably reduced. It can also be observed that in contrast to the signal Sout1(t), the signal Sout2(t) is much more symmetrical and uniform across both rising and falling edges.

Figure 4:
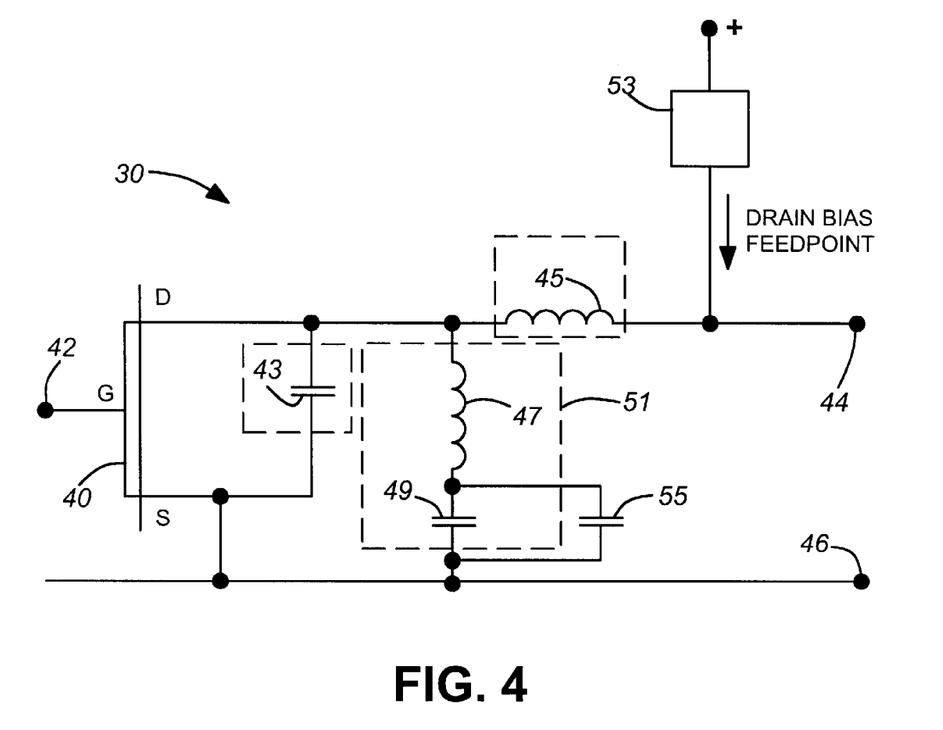
FIG. 4 is a diagram of an RF power transistor circuit packaged with another drain bias circuit connection according to another embodiment of the invention.

In another embodiment, the same result can be achieved without the need for an additional terminal for the drain bias. According to this embodiment which is shown in FIG. 4, the drain bias feedpoint is maintained on the drain terminal 44 and a large capacitor 55 is used across the capacitor 49 of the output impedance matching network 51. In this embodiment, the drain bias 53 must still be designed with a high impedance so as not to have any affect on the transistor output impedance at RF frequencies. With the large capacitor 55 placed across the capacitor 49 which is a low RF impedance point, the effect of the resulting high reactive impedance of the drain bias circuit 53 at low frequencies is considerably reduced which therefore significantly reduces hysteresis. Preferably, this capacitor 55 is several orders of magnitude larger than the capacitor 49. For example, if the capacitor 49 is 700 pF (see example given above), the capacitor 55 would preferably be at least several hundreds of microFarads.

The embodiments described above all relate to the output side of an RF power transistor. As noted above, the invention can also apply to reduce hysteresis introduced by the input bias circuit on the input side of an RF power transistor. According to the invention, the input bias circuit is fed through a low RF impedance point on the input side so that at these frequencies, the bias circuit does not adversely impact the transistor output impedance. By removing the effect at RF frequencies of the input bias circuit on the transistor input impedance, the input bias circuit can be also designed with a low reactive impedance at low frequencies to reduce hysteresis without any material consequences on the transistor input impedance.

Figure 5A:
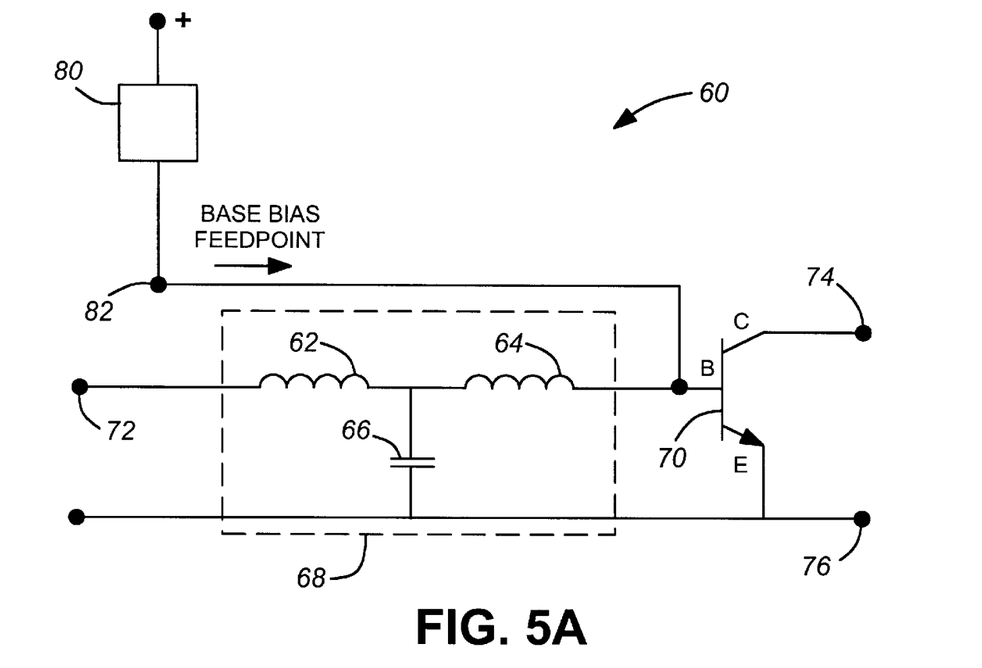
FIG. 5A is a diagram of an RF power transistor circuit packaged with a base bias circuit connection according to another embodiment of the invention.

FIG. 5A shows an example of a BJT transistor circuit designed to reduce hysteresis caused on the input side according to another embodiment of the invention. The BJT RF power transistor circuit 60 generally shown as 60 includes a BJT RF power transistor 70 (hereinafter referred to as the RF power transistor 70) and an input impedance matching network generally indicated by 68.

As is conventional, the RF power transistor 70 has a base B, a collector C and an emitter E. The collector C and emitter E are respectively connected to a collector terminal 74 and an emitter terminal 76 on the transistor circuit 60 while the base B is connected to a base terminal 72 also on the transistor circuit 60 through the input impedance matching network 68. As is conventional, the input impedance matching network 68 includes two inductors 62, 64 connected in series between the base B and the base terminal 72 as well as a capacitor connected at one end to a junction point between the inductors 62, 64 and at the other end to the emitter terminal 76. For base bias, a bias circuit 80 provides the transistor base B with a biasing current which may be for example, a positive DC current. However, it is understood that depending on the BJT design of the transistor 60, the bias circuit 80 could also be connected to provide a negative current feed.

In this particular embodiment, instead of feeding the base bias through the base terminal 72 as is conventionally done, the base bias is fed directly to the base B which represents a low RF impedance point within the transistor circuit 60. For this, the transistor circuit 60 is packaged with an additional terminal 82 to provide the necessary external connectivity for feeding the base bias directly into this low RF impedance point. Again, by feeding the drain bias through a low RF impedance point, the bias circuit 80 no longer adversely impacts the transistor input impedance and can be designed with a lower reactive impedance at low frequencies to reduce hysteresis.

Figure 5B:
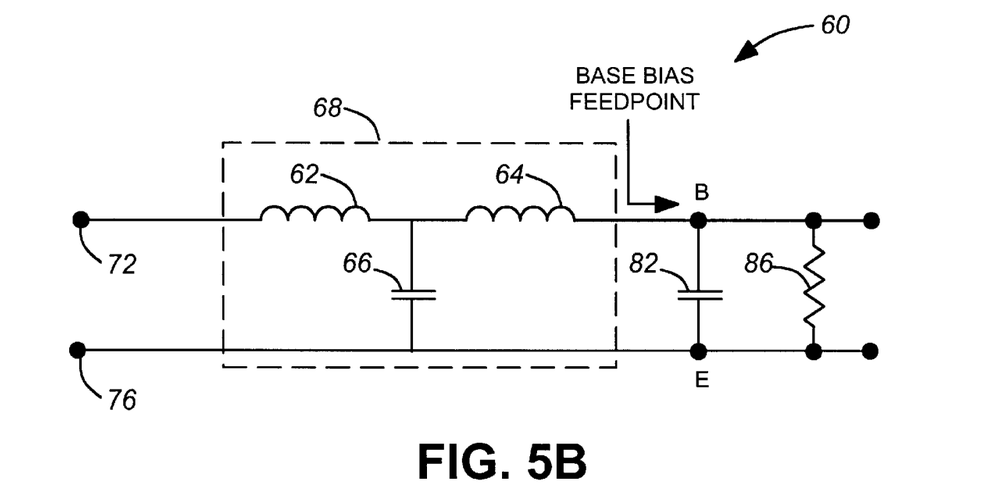
FIG. 5B is an equivalent diagram of the RF power transistor circuit of FIG. 5A at RF frequencies.

To further illustrate this, reference is now made to the diagram of FIG. 5B where the transistor circuit 60 is shown operating at RF frequencies. At these frequencies, the impedance of the RF power transistor as seen between the base B and the emitter E is low and can be modeled as an input capacitance represented by a capacitor 82 connected in parallel with a resistive impedance 86. With the input impedance-matching network, the transistor input impedance as seen between the base and emitter terminals 72, 76 is considerably increased.

In this embodiment, the bias circuit 80 does not affect the transistor input impedance between the base and emitter terminals 72, 76 because the base bias is fed directly to the transistor base B which represents a low RF impedance point. At this particular point, the bias circuit 80 is essentially shorted out. The bias circuit 80 can as a result be designed with a much lower reactive impedance at low frequencies to reduce hysteresis without adversely affecting the transistor input impedance.

The RF power transistor circuit 60 described above in relation to FIGS. 5A and 5B is illustrative of cases where an additional terminal is required for the base bias. However, this may not always be the case. For some conventional RF power transistors such as LDMOS RF power transistors where the input impedance matching network is located externally to the transistor circuit package, a low RF impedance point may be available externally outside the transistor circuit package. As a result, it may not be necessary to use an additional input bias terminal to connect to a low RF impedance point. For a case where the input impedance matching network is outside the transistor circuit package, the transistor base may be connected directly to the base terminal therefore providing a low RF impedance point at the terminal. Instead of feeding the base bias through a different (dedicated) terminal to reach the transistor base, the base bias could be fed directly through the base terminal if such terminal is directly connected to the transistor base.

While the invention has been described with reference to a particular type of RF power transistor, further modifications and improvements to apply the invention to other RF power transistors which will occur to those skilled in the art, may be made within the purview of the appended claims, without departing from the scope of the invention in its broader aspect.

In particular, with respect to the output side, the invention has been described above in relation to LDMOS transistors. It is to be understood that the Inventions is not restricted to this particular type of MOSFET transistor and could also apply to other types of MOSFET transistors and other transistors including BJT transistors for example. Similarly, with respect to the input side, the invention is not restricted to BJT transistors and could also apply to other types of RF power transistors including MOSFET transistors for example. Generally stated, the invention could be applied to any power transistor that can operate at RF frequencies.

The embodiments have been described with respect to particular examples of low RF impedance points. It is also to be understood that the invention is not restricted as such. Other points could also be used for biasing provided they represent a low impedance point at RF frequencies. With respect to the output side, there may be low RF reference points which can be used other than between the inductor 47 and the capacitor 49 of the output impedance matching network 51. If for example, other output impedance matching networks are used, there may be other low RF impedance points available. With respect to the input side, there may be low RF reference points available other than the gate/base terminal. For example, the input impedance matching network may provide another perhaps more suitable low RF impedance point. In this particular case, instead of feeding the gate/base bias through the gate/bias terminal directly as described above, it may be possible to feed the gate/base through the low RF impedance point provided in the input impedance matching network.

Figure 6A:
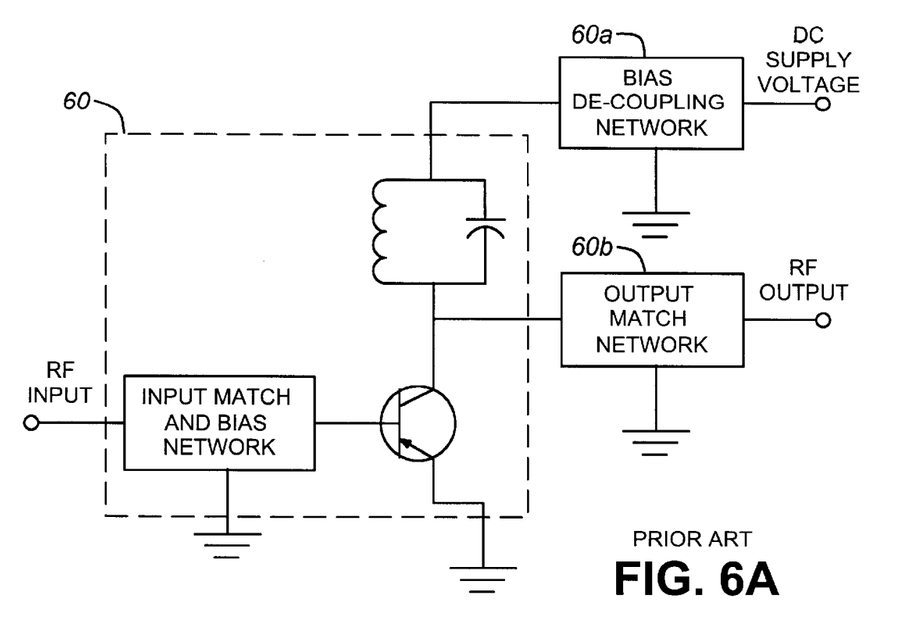
FIG. 6A is a diagram of a conventional output bias for an RF power transistor circuit packaged with a capacitor/inductor high impedance resonator.
Figure 6B:
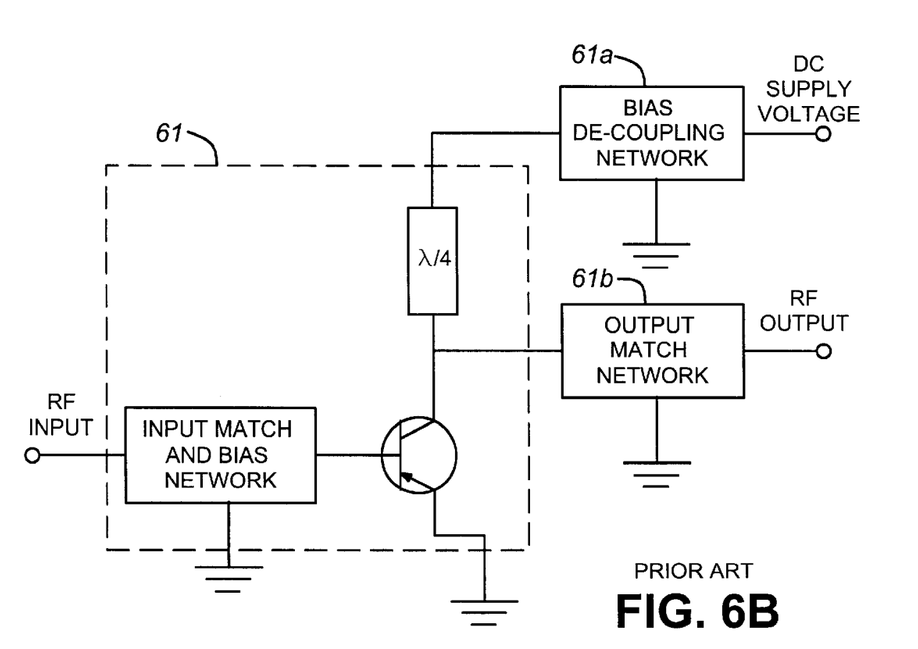
FIG. 6B is a diagram of a conventional output bias for an RF power transistor circuit packaged with a quarter-wavelength high impedance resonator.

FIGS. 6A and 6B show conventional output biases for RF power transistor circuits 60, 61 packaged, respectively, with a capacitor/inductor high impedance resonator 60 and a quarter-wavelength high impedance resonator 61. Such biasing is accomplished during manufacture of the given RF power transistor circuits 60, 61 and remains fixed during use. This conventional approach where the RF match 60b, 61b is designed and the bias 60a, 61a then added results in unacceptably high levels of hysteresis. The bias 60a, 61a is termed bias de-coupling networks to better illustrate their functionality which is well known in RF terminology—i.e., it is well understood in the art that bias de-coupling is the RF isolation from the DC supply.

Figure 7A:
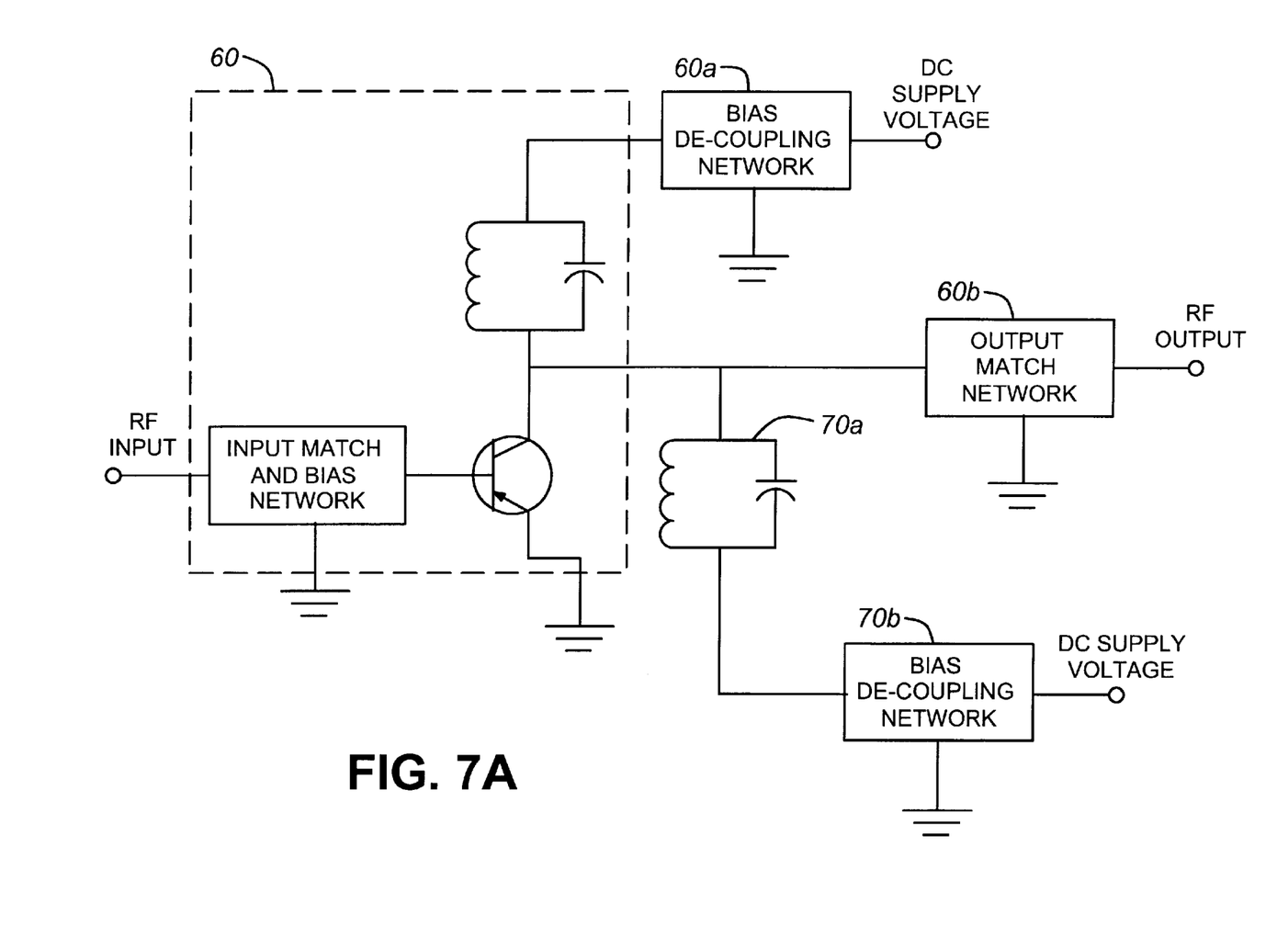
FIG. 7A is a diagram of an RF power transistor circuit packaged with a capacitor/inductor high impedance resonator and an auxiliary bias feed according to still another embodiment of the invention.
Figure 7B:
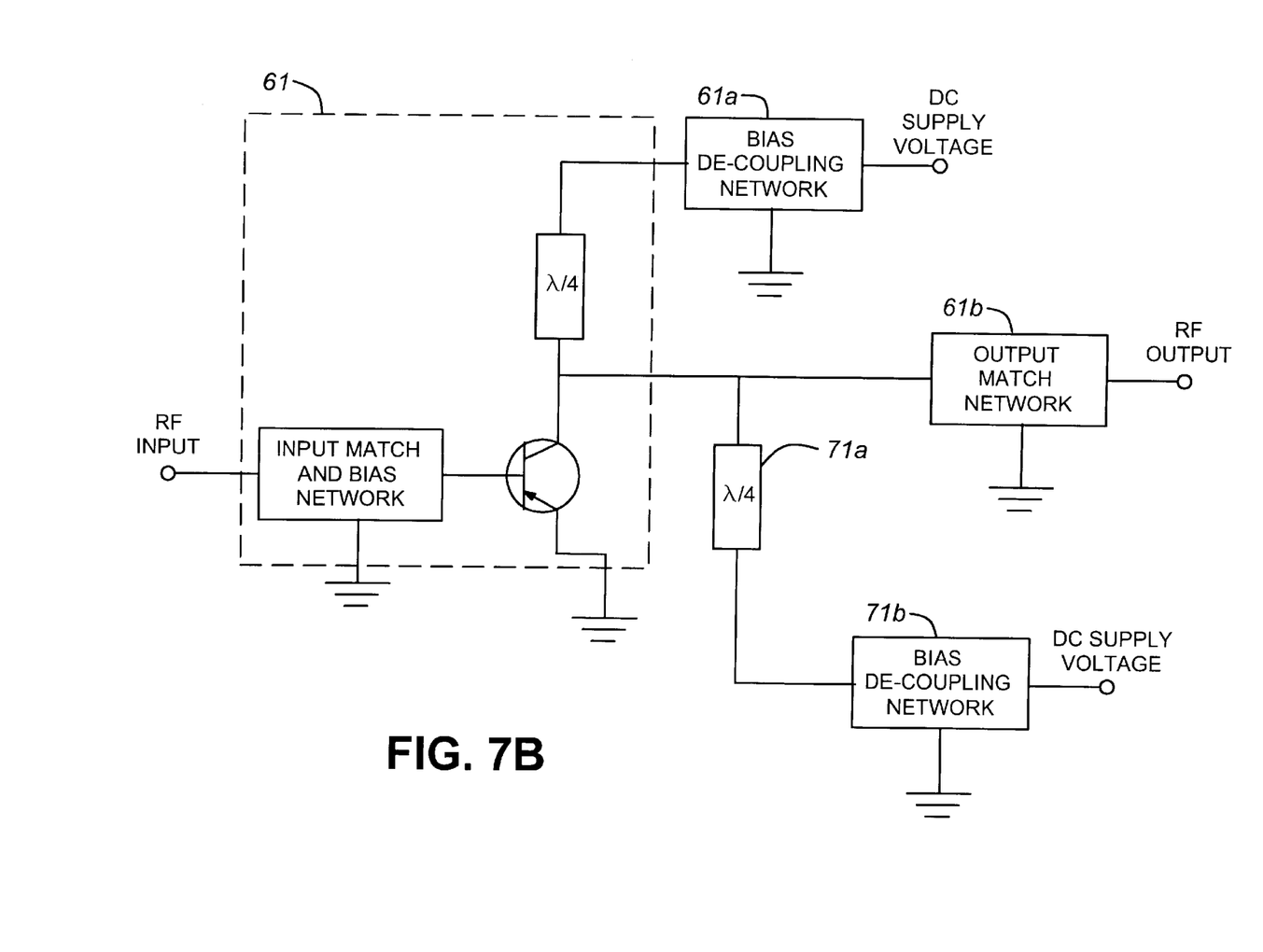
FIG. 7B is a diagram of an RF power transistor circuit packaged with a quarter-wavelength high impedance resonator and an auxiliary bias feed according to still another embodiment of the invention.

FIG. 7A is a diagram of an RF power transistor circuit 60 packaged with a capacitor/inductor high impedance resonator and having an auxiliary bias feed according to still another embodiment of the invention. The auxiliary bias feed includes a capacitor/inductor high impedance resonator 70a and a bias de-coupling network 70b connected between the transistor and the DC supply voltage. It should be noted that the auxiliary bias feed (collectively 70a and 70b) is external to the RF power transistor circuit package 60. That is to say, the auxiliary bias feed is beneficially added after initial manufacture of the RF power transistor circuit package 60 so as to allow a circuit designer to utilize standard transistor packages. By using "off-the-shelf" transistor packages and customizing them according to the present invention to obtain hysteresis reductions as needed, overall costs can be reduced. The auxiliary bias feed itself is designed so as to compensate for any changes induced by the existing bias. This affords the circuit designer flexibility. As well, the auxiliary bias feed may consist of one or more components that are self-resonant at the RF frequency of interest for the given design such that the impedance at RF frequencies is nearly infinite and the impedance at the baseband frequencies is low. Such an example of the use of differing components is shown in FIG. 7B where a diagram of an RF power transistor circuit 61 packaged with a quarter-wavelength high impedance resonator and having an auxiliary bias feed (collectively 71a and 71b) of the quarter-wavelength high impedance resonator type according to the present invention is shown. Still further, the auxiliary bias feed according to the present invention may consist of multiple bias feeds in parallel at DC so as to enable a further reduction of impedance.

While the embodiments of the present invention were described in specific terms, it should nonetheless be recognized that a variety of components might be similarly utilized within the present invention without straying from the intended scope of the invention. Persons skilled in the art will appreciate that there are yet more alternative implementations and modifications possible for implementing the present invention, and that the above implementations are only an illustration of some embodiments of the invention. Accordingly, the scope of the invention is intended only to be limited by the claims included herein.

We claim:

1. A radio frequency (RF) power transistor circuit comprising:

an RF power transistor with a gate/base, a drain/collector and a source/emitter;

an output matching network connected between said drain/collector and an RF output of said RF power transistor circuit;

a first bias de-coupling network connected between said drain/collector and a supply voltage of said RF power transistor circuit; and a second bias de-coupling network connected in series with a capacitor and an inductor connected in parallel and together connected between said drain/collector and said supply voltage.

2. The RF power transistor circuit of claim 1 wherein said output matching network, said first bias de-coupling network, said second bias de-coupling network, said capacitor, and said inductor are packaged together yet separately from said RF power transistor.

3. A method of biasing an RF power transistor in an RF power transistor circuit within an integrated circuit (IC) package, said method comprising:

generating a first biasing current within said IC package;

feeding said first biasing current generated to a low RF impedance point in said RF power transistor circuit to bias said RF power transistor;

generating a second biasing current separate and distinct from said first biasing current; and feeding said second biasing current generated to said low RF impedance point in said RF power transistor circuit to further bias said RF power transistor and substantially reduce hysteresis.

4. The method of claim 3 wherein generating said first biasing current and said second biasing current each include generating a drain/collector biasing current.

5. The method of claim 3 wherein feeding said second biasing current generated to said low RF impedance point in said RF power transistor circuit to bias said RF power transistor includes feeding said second biasing current generated through a dedicated terminal on said IC package connected to said low RF impedance point.

6. A radio frequency (RF) power transistor circuit comprising:

an RF power transistor with a gate/base, a drain/collector and a source/emitter;

an output matching network connected between said drain/collector and an RF output of said RF power transistor circuit;

a first bias de-coupling network connected between said drain/collector and a supply voltage of said RF power transistor circuit; and a second bias de-coupling network connected in series with a quarter-wavelength resonator and together connected between said drain/collector and said supply voltage.

7. The RF power transistor circuit of claim 6 wherein said output matching network, said first bias de-coupling network, said second bias de-coupling network, and said quarter-wavelength resonator are packaged together yet separately from said RF power transistor.

* * * * *